United States Patent

Charra

[11] Patent Number: 5,831,259
[45] Date of Patent: Nov. 3, 1998

[54] ELECTROOPTICAL TRANSDUCER UTILIZING PHOTOLUMINESCENT CONJUGATE OLIGOMERS

[75] Inventor: Fabrice Charra, Hárcoussis, France

[73] Assignee: Commissariat A L'Energie Atomique, Paris, France

[21] Appl. No.: 750,027
[22] PCT Filed: Jun. 27, 1995
[86] PCT No.: PCT/FR95/00852
    § 371 Date: Nov. 25, 1996
    § 102(e) Date: Nov. 25, 1996
[87] PCT Pub. No.: WO96/00904
    PCT Pub. Date: Jan. 11, 1996

[30] Foreign Application Priority Data

Jun. 28, 1994 [FR] France .................. 94 07947

[51] Int. Cl.⁶ ................................. H01J 40/14
[52] U.S. Cl. .................. 250/214.1; 250/214 LS; 250/484.2
[58] Field of Search .................. 250/214.1, 484.2, 250/214 R, 483.1, 214 LS; 257/40; 313/504, 503, 491, 483

[56] References Cited

FOREIGN PATENT DOCUMENTS 254601  1/1988  European Pat. Off. .

OTHER PUBLICATIONS

CPEM '88 Digest, 7 Jun. 1988, Tsukuba, Ibaraki, Japan, pp. 89–90, Mahmoud A. El–Sherif, "On–Fiber Sensor and Modulator".

Primary Examiner—Que Le
Attorney, Agent, or Firm—Pearne, Gordon, McCoy & Granger LLP

[57] ABSTRACT

A high impedance electrooptical transducer, such as for use in an optical output sensor. The transducer includes an electrosensitive element that emits photoluminescence radiation when illuminated by an excitation radiation. The electrosensitive element includes conjugate photoluminescent oligomers. The photoluminescence efficiency of the conjugate oligomers varies in the presence of an electrical field.

11 Claims, 3 Drawing Sheets

ELECTROOPTICAL TRANSDUCER UTILIZING PHOTOLUMINESCENT CONJUGATE OLIGOMERS

BACKGROUND OF THE INVENTION

The present invention relates to a high impedance electrooptical transducer. It more particularly applies to optical output sensors.

The sensors are components ensuring the input interface of various systems. They convert a quantity to be measured (e.g. chemical, mechanical or electromagnetic quantity) into a quantity directly usable by the data processing unit of such systems, i.e. an electrical or optical quantity.

Optical output sensors have the following recognized advantages:

insensitivity to electromagnetic interference, possibility of the deflection of the measurement by optical fibres, suitability for miniaturization.

However, the development of electrical output sensors remains more advanced.

However, consideration has been given to associating with an electrical output sensor an electrooptical transducer in order to obtain an optical output. For example, optical pressure sensors have been implemented by associating with a piezoelectric block or shim (mechanical sensor with electrical output) a light emitting diode, which then supplies an optical output.

The miniaturization of optical output sensors gives rise to sensitivity problems associated with the limitation of the available energy.

Thus, optical output microsensors generally only have the energy supplied by the signal to be measured (so-called autogenerating sensors) or a light energy supplied by a probe waveguide (so-called optosupplied sensors). The aforementioned pressure optical sensors are autogenerating.

Moreover, numerous optical output sensors are based on photoluminescence measurements (cf. document (1) which, like the other documents referred to hereinafter, is listed at the end of the description), the exciting light being transmitted to such a sensor by the same waveguide as that collecting the photoluminescence light. These optical output sensors are optically supplied.

However, the energy supplied by the signal to be measured is generally proportional with the sensor size. For example, the electrical energy supplied by a piezoelectric shim is proportional to the surface of the latter.

An electrooptical transducer to be associated with an electrical output microsensor (or itself used as an electrical sensor) must consequently consume very little electrical energy, which means that it must have a very high input impedance.

At present, the integrated electrooptical transducers having the highest input impedances are modulators based on the electrooptical effect. These transducers:

a1) require oriented materials (polarized polymers or crystals) for their manufacture, a2) require a coherent probe light (laser), a3) require the use of monomode waveguides, a4) have an input capacitance above 5 pF for a 50% modulation with a voltage of 10 V, a5) allow frequencies which can reach 1 GHz, a6) permit coherence multiplexing (cf. document (2)).

Electrooptical transducers known as luministors have been proposed and are based on photoluminescence variations of conductive polymers, which are due to the doping-dedoping (oxidation-reduction) induced by an electrical potential (cf. document (3)).

These transducers do not have to satisfy conditions a1) to a3) defined above. However:

b1) their sensitivity remains low, which imposes a high input capacitance (above 5 pF) in order to obtain an adequate signal, b2) the frequencies allowed by these transducers are limited to a few Hertz.

SUMMARY OF THE INVENTION

The present invention relates to an electrooptical transducer not suffering from the disadvantages b1) and b2).

More specifically, the present invention relates to an electrooptical transducer incorporating an electrosensitive element exposed to the emission of a photoluminescence radiation when illuminated by an excitation radiation, said transducer being characterized in that the electrosensitive element comprises photoluminescent conjugate oligomers, which are exposed to a variation of their photoluminescence efficiency in the presence of an electrical field.

The electrooptical transducer according to the invention is based on the photoluminescence variations of a certain class of molecules (photoluminescent conjugate oligomers), when said molecules are exposed to an electrical field.

The transducer according to the invention has a much higher sensitivity than that of luministors (in which the molecules are not directly sensitive to the electrical field, but are instead sensitive to the presence of electrical charges).

It has an input capacitance of about 100 femtofarads and is able to allow frequencies above 1 GHz.

Thus, this transducer permits the production of optical output, optically supplied electrical sensors. It also gives an optically supplied optical output to electrical output autogenerating microsensors.

Certain optical output chemical sensors are based on the reduction of the photoluminescence of fluorophores, said reduction being produced by the action of the molecules to be detected (see document (1)). In such sensors, each sensed or trapped molecule eliminates the photoluminescence of a fluorophore.

As will become more apparent hereinafter, in certain special embodiments, the transducer according to the invention makes it possible to eliminate the luminescence of several hundred fluorophores per sensed molecule, which leads to an increase in the sensitivity compared with said known chemical sensors.

The transducer according to the invention has other fields of application compared with the sensors. Its low switching energy and its wide passband are useful in the optical transmission of information.

As the modulated light is incoherent, it can only be a short distance transmission (a few meters), e.g. on an optical bus.

Moreover, the possibility of producing transducers according to the invention having large surfaces, with reasonable control energies, leads to applications in the field of screens and display equipment.

In the present invention, said oligomers can be chosen from within a first group including paraphenylene oligomers and thiophene oligomers, the number N of monomers of said oligomers being such that $8 \leq N \leq 12$.

It is also possible to choose these oligomers in a second group including oligomers of paraphenylene-ethenylene and oligomers of thiophene-ethenylene, the number N of monomers of said oligomers being such that $4 \leq N \leq 10$.

Preferably, the number of monomers of said oligomers is equal to 8 in the first case and 4 in the second, with a view to obtaining the highest possible input impedance.

According to a first embodiment of the transducer according to the invention, the electrosensitive element comprises a layer containing said oligomers and means for applying a macroscopic electrical field to said layer.

The electrical field application means can comprise two electrodes respectively placed on either side of the layer. At least part of said two electrodes can be transparent to the excitation radiation and to the photoluminescence radiation.

According to a second embodiment of the transducer according to the invention the electrosensitive element also comprises ionophore molecules able to selectively sense given ions, each sensed ion creating a microscopic electrical field to which are exposed said oligomers.

In this case, the transducer also comprises an optical waveguide for the propagation of the excitation radiation and the photoluminescence radiation and the electrosensitive element is fixed to one end of said waveguide.

In another variant corresponding to this case, the transducer also comprises an optical waveguide for the propagation of the excitation radiation and the photoluminescence radiation and the electrosensitive element is fixed to the periphery of the waveguide, the coupling of the electrosensitive element to said waveguide being by evanescent waves.

BRIEF DESCRIPTION OF THE DRAWINGS

The invention is described in greater detail hereinafter relative to nonlimitative embodiments and with reference to the attached drawings, wherein show.

DETAILED DESCRIPTION OF THE PREFERRED EMBODIMENTS

Figure 1:
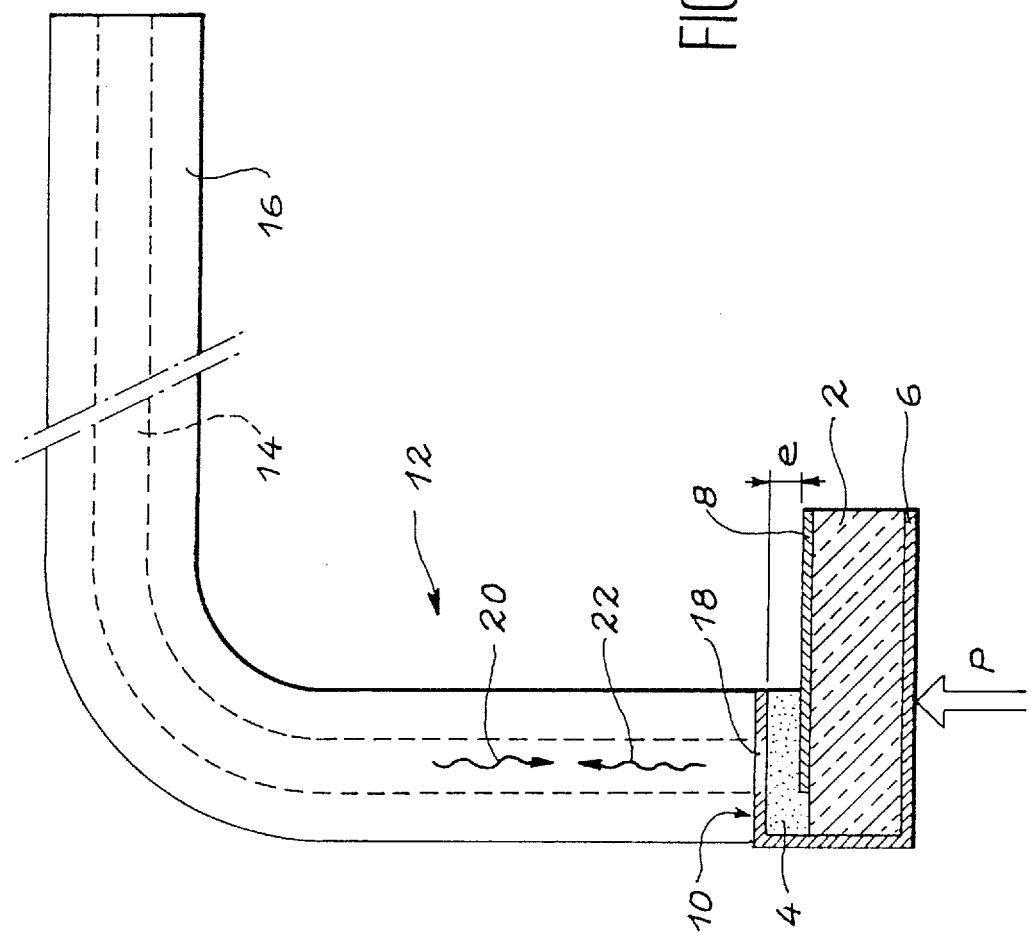
FIG. 1 A diagrammatic view of an embodiment of the electrooptical transducer according to the invention having a layer of photoluminescent conjugate oligomers between two electrodes, whereof one has at least one transparent zone for the excitation of the layer and the recovery of the photoluminescence radiation.

It is pointed out that photoluminescence is a light emission phenomenon at a wavelength $\lambda F$ by a material excited by the illumination at a wavelength $\lambda E$ lower than $\lambda F$.

The photoluminescence efficiency is the ratio of the number of photons absorbed by the material to the number of photons reemitted by said material.

The operation of the transducer according to the invention is based on the reduction of the photoluminescence efficiency of a material described hereinafter, under the action of an electrical field (and not by doping as in luministors).

The organic molecules able to absorb light at the wavelengths of the visible range are those which have a system of conjugate electrons $\pi$, i.e. delocalized electrons, which can be displaced on several atoms.

The absorption of a photon by such a system leads to the generation of excited states. The nature of these states is highly dependent on the size of the conjugate electron system.

In small molecules such as fluoroscein (whereof a derivative is used in document (2)), the excited state reaches is a singlet state. Such a state has a very high probability of reemitting a photon returning to the fundamental state. This is the fluorescence phenomenon.

For very large conjugate systems, such as those of polythiophene and polyphenylene-ethenylene, which are semiconductor polymers, the optical excitation leads to the generation of an electron-hole pair.

The charges of this pair are able to move along the conjugate system giving rise to the photoconductivity phenomenon.

However, when recombination takes place, an electron-hole pair only has a 25% probability of forming a fluorescent singlet state and a 75% probability of forming a non-fluorescent triplet state.

Therefore these polymers have a lower photoluminescence efficiency than fluorophores with a small conjugate system such as fluorescein. The photoconductivity reduces the fluorescence efficiency.

The present invention uses photoluminescent conjugate oligomers (electrosensitive fluorophores) of size intermediate between the conventional fluorophores formed by small molecules and the semiconductor polymers.

Use is e.g. made of paraphenylene oligomers, whose formula is given hereinafter in a), with a number n1 of monomers such that $8 \leq n1 \leq 12$, or thiophene oligomers, whose polymer is given in b) below, also with n1 monomers such that $8 \leq n1 \leq 12$:

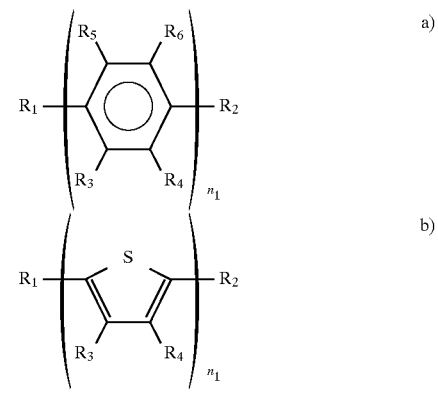

In the invention, it is also possible to use paraphenylene-ethenylene oligomers, which are also called paraphenylene-vinylenes and whose formula is given in c) below, with a number n2 of monomers such that $4 \leq n2 \leq 10$, or oligomers of thiophene-ethenylene, whose formula is given in d) below, also with a number n2 of monomers such that $4 \leq n2 \leq 10$:

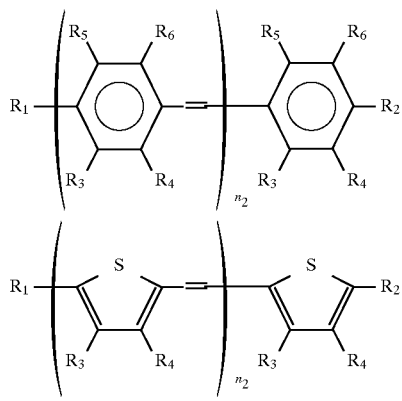

These oligomers, whose formulas are given in a), b), c) and d), have a fluorescence efficiency intermediate between that of a fluorophore like terthiophene (formula b) with n1=3) or stilbene (formula c) with n2=1) and that of a polymer.

In the oligomers used in the invention, the direct photo-generation of a fluorescent singlet state and the creation of an independent electron-hole pair, which is only slightly fluorescent, have probabilities close to one another. Therefore these two relaxing paths are concurrent.

It has been found that these probabilities are highly dependent on the presence of an electrical field. Such a field greatly favours the electron-hole pair separation under the effect of the excitation radiation, which reduces the fluorescence efficiency.

The light intensity emitted by fluorescence under constant intensity optical excitation therefore forms a probe of the electrical field to which these oligomers are exposed.

Moreover, the movement of charges in an electrical field consumes the energy of the latter. In other words, the presence of mobile charges in a material increases its conductivity and therefore reduces the electrical impedance thereof.

In the present invention, the use of reduced size oligomers decreases the mobility of the charges and therefore minimizes energy consumption.

Thus, preference is given to the use of oligomers corresponding to formula a) or b) with a number n1 of monomers equal to 8, or oligomers corresponding to formula c) or d) with a number n2 of monomers equal to 4.

However, it has been found that for unsubstituted oligomers of type c), the values n2=4 or n2=5 or n2=6 provided a good compromise. The photoluminescence efficiency of such oligomers is reduced by 40% under the effect of an electrical field of $2 \times 10^5$ V/cm.

In formulas a), b), c) and d), $R_1$ to $R_6$ represent random groups, provided that said groups do not deteriorate the conjugate chains. In the simplest example, $R_1$ to $R_6$ represent hydrogen atoms. However, the oligomers of formulas a), b), c) and d) can be substituted.

In particular, the groups $R_1$ to $R_6$ of formulas a), b), c) and d) can be:

electrodonor groups (e.g. amino or methoxy) or electroacceptor groups (e.g. nitro or cyano), so that it is possible to modify the excitation and emission wavelengths of the oligomers by modifying these groups, or crosslinking agents, i.e. covalent chemical bridges making it possible to attach the oligomers to one another or attach said oligomers to a host polymer, such as e.g. PMMA, so that it is possible to modify the mechanical properties of the material containing the oligomers by modifying these crosslinking agents, or solubilizing groups making it possible to make said material or part thereof soluble in the desired solvent, particularly for producing Langmuir-Blodgett-type layers, whose interest will become apparent hereinafter.

A description will now be given with reference to FIGS. 1 and 2 of two transducers according to the invention, in which the oligomers are subject to a macroscopic electric field.

Figure 2:
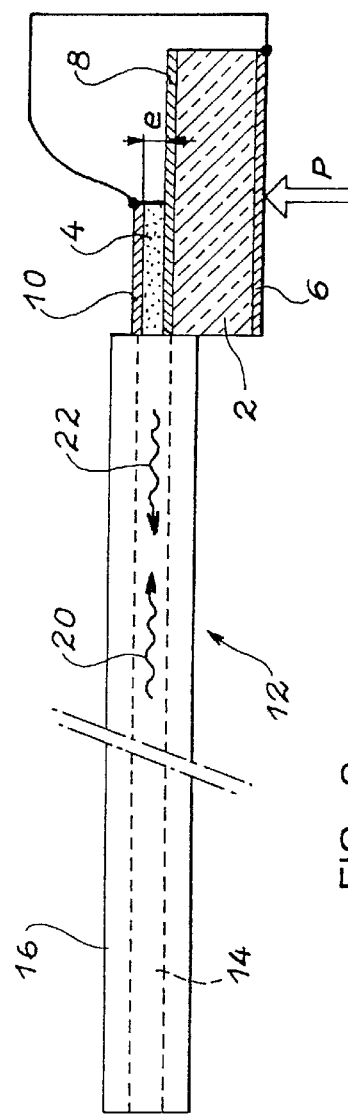
FIG. 2 A diagrammatic view of a variant of the transducer of FIG. 1, in which the excitation of the layer and the recovery of the photoluminescence radiation take place by the edge of the layer.

In the embodiments shown in FIGS. 1 and 2, the transducers are associated with piezoelectric shims 2 for forming optical pressure sensors.

The transducer diagrammatically shown in FIG. 1 comprises an electrically insulating thin film 4, e.g. of polystyrene or PMMA, containing oligomers corresponding to one of the formulas a) to d) (electrosensitive fluorophores) or a mixture of oligomers corresponding to several of these formulas.

Electrodes 6 and 8 are respectively formed on opposite faces of the piezoelectric shim 2. One face of the film 4 is placed against the electrode 8, as shown in FIG. 1. The other face of the film 4 is covered by an electrode 10 electrically connected to the electrode 6. The electrode 8 is common to the shim 2 and to the film 4, but is electrically insulated from the electrode 10.

This gives a planar capacitor constituted by the film 4 and the electrodes 8 and 10.

The transducer shown in FIG. 1 also comprises an optical waveguide 12 such as an optical fibre, whose core 14 and optical cladding 16 can be seen in FIG. 1. At one end of said fibre, the core 14 is optically coupled to the film 4 across the electrode 10.

In order to carry this out, at least the portion 18 of said electrode 10 positioned facing the fibre core 14, is transparent to the radiation 20 intended to excite the oligomers of the film 4 and to the photoluminescence radiation 22 emitted by said oligomers when they are excited by the radiation 20. This portion or simply the entire electrode 10 can be of indium and tin oxide.

In the embodiment of FIG. 1, the excitation radiation 20 is emitted by an appropriate light source 24 (chosen as a function of the oligomers used) and fed into the core of the fibre, at the other end thereof, by means of a mirror 26 able to reflect said radiation. The mirror 26 is also transparent to the photoluminescence radiation 22 passing out of said other end and which is detected by detection means 28 after traversing the mirror 26.

A pressure P applied to the piezoelectric shim 2 produces an electrical field between the electrodes 6 and 8 and therefore between the electrodes 8 and 10.

Thus, the oligomers contained in the film 4 are exposed to said field and their photoluminescence efficiency varies.

The detection means 28 make it possible to detect photoluminescent variations and therefore variations of the electrical field and consequently pressure variations.

In the variant diagrammatically shown in FIG. 2, the electrode 10 is opaque to the radiations 20 and 22.

The core 14 of the optical fibre 12 is optically coupled to the film 4 containing the oligomers, by the edge of said film, as can be seen in FIG. 2. The thickness e of the film 4 is sufficient to permit said coupling. The choice of the thickness e makes it possible to match the impedance of the transducer to the impedance of the source (which is constituted by the piezoelectric sensor in the embodiments of FIGS. 1 and 2).

The surface value s of the faces of the film 4 carrying the electrodes 8 and 10 results from a compromise between the need to have a high impedance and therefore a small surface and the need to use a large number of oligomers in order to limit the ageing of the transducer.

Thus, the light excitation of an oligomer can, in the long term, modify the latter by photochemistry and therefore deteriorate the properties thereof.

As a minimum luminescence intensity is imposed by the detector 28 used, there is an interest in using a large number of molecules (oligomers) in order to reduce the frequency of the excitations to which each is exposed.

For example, there is a photoluminescence efficiency reduction by 40% to the oligomer of type c) ($n_2$=4) vacuum-deposited in amorphous film form (the deposition rate being approximately 1 nm/s) with a thickness of 50 nm and on a surface of $10^3$ $\mu m^2$, when the capacitor constituted by the film and electrodes on either side thereof is charged under a voltage of 2 V, which corresponds to an electrical charge of $4\times10^{-13}$ C. Such a charge can be supplied by a 1 $m^2$ piezoelectric shim for a thickness of 0.2 mm, said shim being exposed to a pressure of $10^5$ Pa (10 N/cm$^2$).

It should be noted that a sensitivity gain of up to a factor of 3 can be obtained by the use of a material in which the oligomers are all parallel to the electrical field (in an amorphous material the chromophores are oriented in random manner, the effective mean electrical field then being lower than the field applied).

Such an orientation can e.g. be obtained by producing Langmuir-Blodgett-type films.

It is also possible to improve the sensitivity for small photoluminescence variations by using oligomers of type a), b), c) or d), whose groups $R_1$ and $R_2$ are respectively an electrodonor group and an electroacceptor group and by orienting said oligomers (polar molecules) in the same direction, e.g. by the corona polarization method described in document (4).

Figure 3:
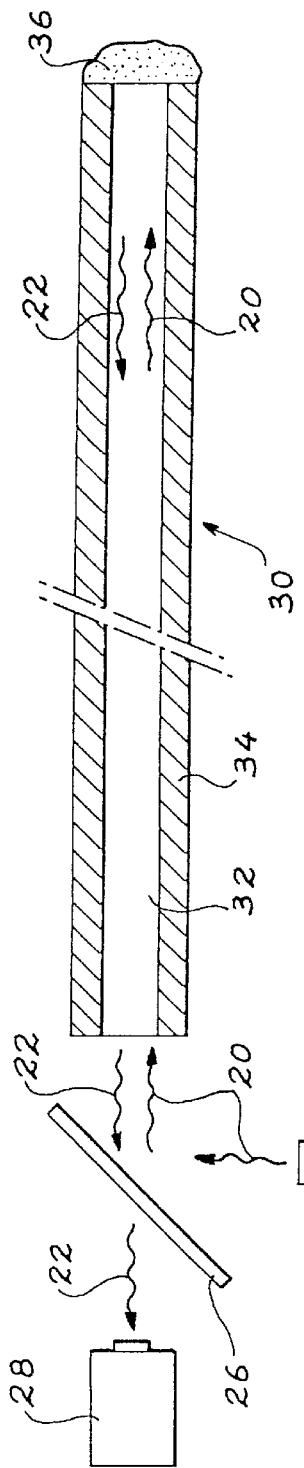
FIG. 3 A diagrammatic view of another embodiment of the electrooptical transducer according to the invention, in which the photoluminescent conjugate oligomers are located at the end of an optical waveguide.
Figure 4:
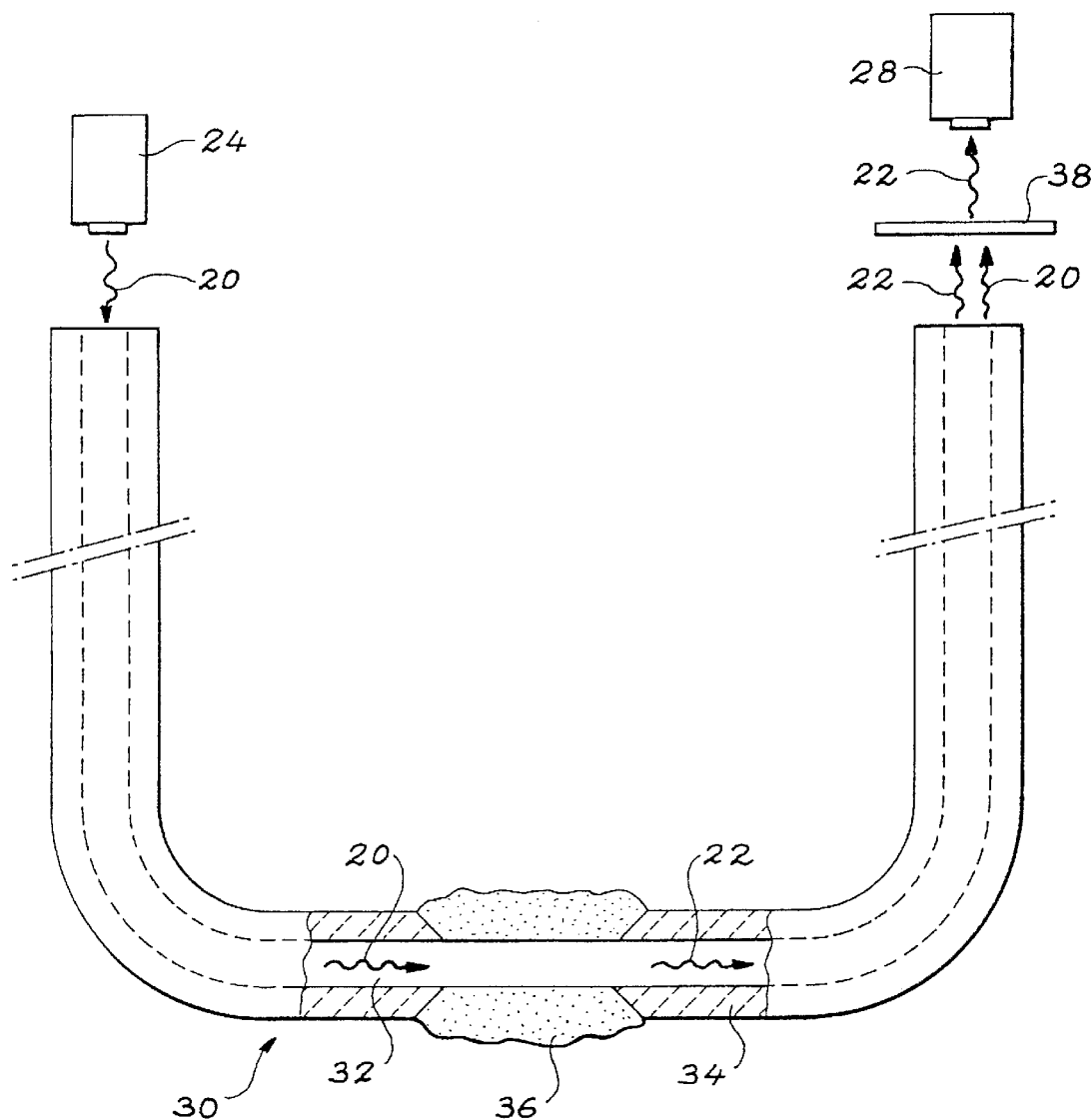
FIG. 4 A diagrammatic view of a variant of the transducer of FIG. 3, in which the oligomers are located on the waveguide periphery.

FIGS. 3 and 4 diagrammatically show transducers according to the invention, in which the oligomers can be exposed to a microscopic electrical field.

Numerous chemical sensors are based on optical measurements performed by means of a colour or fluorescent indicator linked with a selective permeability membrane, which is itself immobilized on the surface or at the end of an optical fibre.

The sensitive material of such sensors comprises sites able to selectively sense certain ions, said sites e.g. being ring-like ionophore molecules of the type shown in FIG. 6 of document (5).

With each site is associated a fluorophore or chromophore, whose optical properties change when an ion is sensed. It is often the ion $H_3O^-$ for pH measurements (cf. document (1)) or the ion $K^+$ (cf. document (5)).

However, the electrical field around an ion exceeds $2\times10^5$ V/cm within a sphere of radius 12 nm, i.e. in a volume of $7\times10^3$ nm$^3$.

The volume of the oligomers whose formulas are given a), b), c) and d) is smaller than 0.5 nm$^3$, so that a selective membrane containing, apart from ionophore molecules (such as e.g. the aforementioned ring-like ionophore molecules), oligomers with a concentration of approximately 10 vol. %, leads to the elimination of the photoluminescence of more than $10^3$ of said oligomers for each sensed ion.

Instead of mixing within the membrane the oligomers and ionophore molecules, it is possible to graft by covalent bonds several of said oligomers to each ionophore molecule used.

FIG. 3 shows a transducer according to the invention constituting a chemical sensor. This sensor is intended to detect the presence of ionized chemical species in a fluid (liquid or gas).

The sensor diagrammatically shown in FIG. 3 comprises an optical waveguide, such as an optical fibre 30, whose core 32 and optical cladding 34 can be seen in FIG. 3.

A sensitive material 36 formed by a membrane containing the oligomers and ionophore molecules (chosen as a function of the ions to be detected) is fixed to one end of the optical fibre 30, as can be seen in FIG. 3. This membrane is e.g. a selective permeability membrane based on polymethyl methacrylate (PMMA) or polycarbonate.

As in the case of FIGS. 1 and 2, facing the other end of the optical fibre 30 is positioned the mirror 26 with which is associated the light source 24 able to emit the excitation radiation 20 (for exciting the oligomers) and the detection means 28 of the photoluminescence radiation 22 emitted by the excited oligomers.

If the sought chemical species is in the analyzed fluid, the ions of said chemical species are fixed to the ionophore molecules contained in the sensitive material 36. A microscopic electrical field is then created around said ionophore molecules and this electrical field acts on the oligomers in the vicinity thereof. This leads to a variation of the photoluminescence of these oligomers and this photoluminescence variation is detected by the detection means 28.

In the variant illustrated in FIG. 4, the sensitive material 36 is not fixed to one end of the optical fibre 30. Instead, a portion of the optical cladding 34 of the fibre 30 is eliminated from part of said fibre and replaced by the sensitive material 36 incorporating a polymer membrane "doped" by oligomers and ionophore molecules chosen in the manner described hereinbefore.

In this case, a coupling takes place by evanescent waves of the sensitive material with the core of the optical fibre. In FIG. 4, the selective mirror 26 of FIG. 3 is unnecessary. It is merely necessary to place the excitation radiation source 20 in front of one end of the optical fibre 30 and, facing the other end thereof, the photoluminescence radiation detection means 28, a filter 38, which is able to stop the excitation radiation 20 and permit the passage of the photoluminescence radiation, being interposed between the detection means 28 and said other end of the optical fibre 30, as can be seen in FIG. 4.

If the optical fibre 30 is itself made from polymer, e.g. polystyrene, the sensitive material 36 can be chemically bonded to said fibre.

If the fibre is of silica, the use of a silyl host polymer for receiving the oligomers and ionophore molecules permits an attachment of said polymer to the fibre.

CITED DOCUMENTS (1) L. A. Saari and W. R. Seitz "pH sensor based on immobilized fluoresceinamine" Annals of Chemistry 1982 (54), p 821 (1982).

(2) J. P. Goedgebuer and A. Hamel, "Coherence multiplexing using electrooptic modulators . . . " IEEE Journal of Quantum Electronics 23 (12), p 2224 (1987).

(3) P. Dyreklev, O. Inganäs, J. Paloheimo and H. Stubb, "Photoluminescence quenching in a polymer thin-film field-effect luministor" Journal of Applied Physics 71 (6), p 2816 (1992).

(4) D. S. Chemla and J. Zyss, "Nonlinear optical properties of organic molecules and crystals" (Academic, New York, 1986) vol. 2.

(5) F. Alava-Moreno, R. Pereiro-Garcia, M. E. Diaz-Garcia and A. Sanz-Medel "A comparative study of two different approaches for active optical sensing of potassium with a chromoionophore" Sensors and Actuators B 11, p 413 (1993).

I claim:

1. An electrooptical transducer comprising: an electrosensitive element (4, 36) exposed to emit a photoluminescence radiation (22) when illuminated by an excitation radiation (20), said electrosensitive element (4, 36) comprising photoluminescent conjugate oligomers, wherein the photoluminescence efficiency of the conjugate oligomers varies in the presence of an electrical field.

2. The transducer according to claim 1, wherein the oligomers are chosen from the group consisting of paraphenylene oligomers and thiophene oligomers, the number N of monomers of said oligomers being such that $M \leq N \leq 12$, with M=8.

3. The transducer according to claim 1, wherein the oligomers are chosen from the group consisting of paraphenylene-ethenylene oligomers and thiophene-ethenylene oligomers, the number N of monomers of said oligomers being such that $M \leq N \leq 10$, with M=4.

4. The transducer according to claim 2, wherein the number of monomers of said oligomers is equal to M.

5. The transducer according to claim 1, wherein the electrosensitive element comprises a film (4) containing said oligomers and means (8, 10) for applying a macroscopic electrical field to said film.

6. The transducer according to claim 5, wherein the means for applying the electrical field comprises two electrodes (8, 10) respectively placed on either side of the film (4).

7. The transducer according to claim 6, wherein at least a portion (18) of one (10) of the two electrodes is transparent to the excitation radiation and to the photoluminescence radiation.

8. The transducer according to claim 1, wherein the electrosensitive element (36) also comprises ionosphere molecules able to selectively sense predetermined ions, each sensed ion creating a microscopic electrical field to which are exposed said oligomers.

9. The transducer according to claim 8, wherein the transducer further comprises an optical waveguide (30) for the propagation of the excitation radiation and the photoluminescence radiation and in that the electrosensitive element (36) is fixed to one end of said waveguide.

10. The transducer according to claim 8, wherein the transducer further comprises an optical waveguide (30) for the propagation of the excitation radiation and the photoluminescence radiation and in that the electrosensitive element is fixed to the periphery of the waveguide, the coupling of the electrosensitive element (36) to said waveguide being a coupling by evanescent waves.

11. The transducer according to claim 3, wherein the number of monomers of said oligomers is equal to M.

* * * * *